United States Patent
Lee et al.

(10) Patent No.: US 10,664,720 B2
(45) Date of Patent: May 26, 2020

(54) BLOCK-BASED PRINCIPAL COMPONENT ANALYSIS TRANSFORMATION METHOD AND DEVICE THEREOF

(71) Applicants: Yang-Han Lee, Taoyuan (TW); Li-Ming Chen, Taipei (TW); Ting-Wen Chen, New Taipei (TW); Tzong-Tyng Hsieh, New Taipei (TW)

(72) Inventors: Yang-Han Lee, Taoyuan (TW); Li-Ming Chen, Taipei (TW); Ting-Wen Chen, New Taipei (TW); Tzong-Tyng Hsieh, New Taipei (TW)

(73) Assignee: TAMKANG UNIVERSITY, New Taipei (TW)

( * ) Notice: Subject to any disclaimer, the term of this patent is extended or adjusted under 35 U.S.C. 154(b) by 128 days.

(21) Appl. No.: 16/137,508

(22) Filed: Sep. 20, 2018

(65) Prior Publication Data
US 2019/0095755 A1 Mar. 28, 2019

(30) Foreign Application Priority Data

Sep. 22, 2017 (TW) .............................. 106132684 A

(51) Int. Cl.
*G06K 9/62* (2006.01)
*G06K 9/46* (2006.01)
(Continued)

(52) U.S. Cl.
CPC ......... *G06K 9/6247* (2013.01); *G06K 9/4642* (2013.01); *G10L 15/02* (2013.01);
(Continued)

(58) Field of Classification Search
CPC .............. G06K 9/6247; G06K 9/4642; G06K 9/00523; H03M 7/3068; H03M 7/3082;
(Continued)

(56) References Cited

U.S. PATENT DOCUMENTS 8,090,146 B2 1/2012 Seshadri et al.
9,213,914 B2 12/2015 Oka
(Continued)

FOREIGN PATENT DOCUMENTS

CN 102510491 6/2012
CN 102722866 10/2012
(Continued)

OTHER PUBLICATIONS

A. V. Oppenheim et al., "Discrete-Time Signal Processing", Prentice-Hall, 1999, pp. 1-896.
(Continued)

*Primary Examiner* — Congvan Tran
(74) *Attorney, Agent, or Firm* — JCIPRNET

(57) ABSTRACT

The present invention provides a block-based principal component analysis transformation method and a device thereof. The principal component analysis transformation method includes: obtaining an input signal; dividing the input signal and obtaining a plurality of one-dimension vectors corresponding to the divided input signal, wherein a number of the one-dimension vectors is a division number; after arranging the one-dimension vectors to a two-dimension vector, subtracting an average value of the one-dimension vectors of the division number to obtain a zero-mean vector; calculating a covariance matrix of the zero-mean vector; calculating an eigenvector of the covariance matrix; multiplying the zero-mean vector by the eigenvector to obtain a projection coefficient.

10 Claims, 8 Drawing Sheets

(51) Int. Cl.

| | | |
|---|---|---|
| *G10L 15/02* | (2006.01) | |
| *H03M 7/30* | (2006.01) | |
| *G10L 21/0208* | (2013.01) | |
| *H04N 19/90* | (2014.01) | |
| *H04N 19/176* | (2014.01) | |
| *G10L 19/00* | (2013.01) | |
| G10L 25/27 | (2013.01) | |
| G06K 9/00 | (2006.01) | |
| H04N 19/00 | (2014.01) | |

(52) U.S. Cl.
CPC .......... *G10L 19/00* (2013.01); *G10L 21/0208* (2013.01); *H03M 7/30* (2013.01); *H03M 7/3068* (2013.01); *H03M 7/3082* (2013.01); *H04N 19/176* (2014.11); *H04N 19/90* (2014.11); *G06K 9/00523* (2013.01); *G10L 25/27* (2013.01); *H04N 19/00* (2013.01)

(58) Field of Classification Search
CPC ...... H03M 7/30; G10L 21/0208; G10L 15/02; G10L 19/00; G10L 25/27; H04N 19/176; H04N 19/90; H04N 19/00
USPC ......................................................... 382/277
See application file for complete search history.

(56) References Cited

U.S. PATENT DOCUMENTS

| | | | | |
|---|---|---|---|---|
| 2007/0273576 | A1* | 11/2007 | Struckman | G01S 3/146 342/156 |
| 2008/0130914 | A1* | 6/2008 | Cho | G10L 21/0208 381/94.1 |
| 2009/0304296 | A1* | 12/2009 | Zhang | G06K 9/6217 382/243 |
| 2013/0300596 | A1* | 11/2013 | Shirakawa | G01S 13/42 342/146 |
| 2014/0348231 | A1 | 11/2014 | Chaudhury et al. | |
| 2015/0256850 | A1 | 9/2015 | Kottke et al. | |
| 2017/0069313 | A1* | 3/2017 | Aronowitz | G10L 15/14 |
| 2019/0087717 | A1* | 3/2019 | Manipatruni | G06N 3/06 |

FOREIGN PATENT DOCUMENTS

| | | |
|---|---|---|
| CN | 103208097 | 7/2013 |
| CN | 102567993 | 6/2014 |
| TW | I560072 | 12/2016 |

OTHER PUBLICATIONS

S. Mallat, "A Wavelet Tour of Signal Processing", Academic Press, Oct. 9, 2008, pp. 1-123.

K. Pearson, "On Lines and Planes of Closest Fit to Systems of Points in Space," Philosophical Magazine, vol. 2, No. 6, 1901, pp. 559-572.

M. Turk et al., "Eigenfaces for Recognition," Journal of Cognitive Neuroscience, vol. 3, No. 1, 1991, pp. 71-86.

R. Vidal et al., "Generalized Principal Component Analysis (GPCA)," IEEE Transactions on Pattern Analysis and Machine Intelligence, vol. 27, No. 12, Dec. 2005, pp. 1945-1959.

H. M. Walker, "Degrees of Freedom," Journal of Educational Psychology, vol. 31, No. 4, 1940, pp. 253-269.

G. H. Golub et al., "Matrix Computations", Johns Hopkins, 2013, pp. 1-780.

R. C. Gonzales et al., "Digital Image Processing", Pearson Education, Inc., 1992, pp. 1-797.

J. Devani et al., "Super-Fast Parallel Eigenface Implementation on GPU for Face Recognition," 2014 International Conference on Parallel, distributed and Grid Computing, Aug. 1-2, 2014, pp. 130-136.

M. R. Kawale et al., "Parallel Implementation of Eigenface on CUDA," IEEE International Conference on Advances in Engineering & Technology Research (ICAERT—2014), 2014, pp. 1-5.

Chun-Wei Chu, "Image Denoising Using Principal Component Analysis with Local Pixel Grouping and Neighbor Embedding", Thesis of Master Degree, NTHU, Jul. 2013, pp. 1-50.

* cited by examiner

| | Block Size | time cost for calculating (second) | data size (64 bit float) | PSNR of recovered image (dB) |
|---|---|---|---|---|
| traditional PCA (all data) | | 85631.667417 | $2^{32} + 2^{16}$ | $\infty$ |
| traditional PCA (at 95% confidence level) | | 85631.667417 | $2^{25} + 2^{9}$ | 108.3212 |
| blocked-based PCA transformation (all data) | 2×2 | 0.000176 | $2^{4} + 2^{16}$ | $\infty$ |
| | 4×4 | 0.000234 | $2^{8} + 2^{16}$ | $\infty$ |
| | 8×8 | 0.000656 | $2^{12} + 2^{16}$ | $\infty$ |
| | 16×16 | 0.007747 | $2^{16} + 2^{16}$ | $\infty$ |
| | 32×32 | 0.260417 | $2^{20} + 2^{16}$ | $\infty$ |
| | 64×64 | 28.656612 | $2^{24} + 2^{16}$ | $\infty$ |
| | 128×128 | 1557.484862 | $2^{28} + 2^{16}$ | $\infty$ |
| blocked-based PCA transformation (at 95% confidence level) | 2×2 | 0.000176 | $2^{2} + 2^{14}$ | 6.5021 |
| | 4×4 | 0.000234 | $2^{6} + 2^{15}$ | 6.5088 |
| | 8×8 | 0.000656 | $2^{9} + 2^{13}$ | 6.4954 |
| | 16×16 | 0.007747 | $2^{12} + 2^{12}$ | 6.4883 |
| | 32×32 | 0.260417 | $2^{15} + 2^{11}$ | 6.4841 |
| | 64×64 | 28.656612 | $2^{16} + 2^{9}$ | 6.4550 |
| | 128×128 | 1557.484862 | $2^{16} + 2^{5}$ | 6.3611 |

FIG.9

BLOCK-BASED PRINCIPAL COMPONENT ANALYSIS TRANSFORMATION METHOD AND DEVICE THEREOF

CROSS-REFERENCE TO RELATED APPLICATION

This application claims the priority benefit of Taiwan application serial no. 106132684, filed on Sep. 22, 2017. The entirety of the above-mentioned patent application is hereby incorporated by reference herein and made a part of this specification.

BACKGROUND OF THE INVENTION

Field of the Invention

The invention relates to a block-based principal component analysis transformation method and a device thereof, and more particularly to a principal component analysis transformation method and a device thereof that recover the original signal with a smaller data size.

Description of Related Art

When the traditional principal component analysis (PCA) processes a signal, since the signal has quite large dimensions, the calculation cost for capturing the eigenvector and eigenvalues is also very high. Some related researches proposed solving this problem with hardware, but such solution significantly increases the cost on hardware. As such, how to perform PCA transformation more efficiently is a crucial subject in the industry.

SUMMARY OF THE INVENTION

In this concern, the invention provides a block-based principal component analysis transformation method and a device thereof that completely reconstruct the original signal with a small data size.

The invention provides a PCA transformation method and a device thereof, including: obtaining an input signal; dividing the input signal and obtaining a plurality of one-dimension vectors corresponding to the divided input signal, wherein a number of the plurality of one-dimension vectors is a division number; after arranging the plurality of one-dimension vectors to a two-dimension vector, subtracting an average value of the plurality of one-dimension vectors in the number of the division number to obtain a zero-mean vector; calculating a covariance matrix of the zero-mean vector; calculating an eigenvector of the covariance matrix; and multiplying the zero-mean vector by the eigenvector to obtain a projection coefficient.

In an embodiment of the invention, the input signal is a one-dimension signal, and the processes of dividing the input signal and obtaining the plurality of one-dimension vectors corresponding to the divided input signal includes: dividing the one-dimension signal to a plurality of frames and obtaining the plurality of one-dimension vectors according to a plurality of sampling points corresponding to the plurality of frames.

In an embodiment of the invention, the one-dimension signal is a speech signal.

In an embodiment of the invention, the input signal is a two-dimension signal, and the processes of dividing the input signal and obtaining the plurality of one-dimension vectors corresponding to the divided input signal includes: dividing the two-dimension signal to a plurality of blocks, obtaining a plurality of two-dimension matrices corresponding to a plurality of pixels of the plurality of blocks, and transforming the plurality of two-dimension matrices to the plurality of one-dimension vectors.

In an embodiment of the invention, the two-dimension signal is an image signal.

In an embodiment of the invention, the principal component analysis transformation method of the invention further includes: multiplying the projection coefficient by an inverse matrix of the eigenvector to obtain a reconstructed zero-mean vector; adding the average value to the reconstructed zero-mean vector to obtain a recovered one-dimension vector; and arranging the recovered one-dimension vector to a recovered input signal.

The invention provides a block-based principal component analysis transformation device, including a processor and a memory coupled to the processor, wherein the processor obtains an input signal; divides the input signal and obtains a plurality of one-dimension vectors corresponding to the divided input signal, wherein a number of the plurality of one-dimension vectors is a division number; after arranging the plurality of one-dimension vectors to a two-dimension vector, subtracting an average value of the plurality of one-dimension vectors in the number of the division number to obtain a zero-mean vector; calculates a covariance matrix of the zero-mean vector; calculates an eigenvector of the covariance matrix; and multiplies the zero-mean vector by the eigenvector to obtain a projection coefficient.

In an embodiment of the invention, the input signal is a one-dimension signal, and the processor divides the one-dimension signal to a plurality of frames and obtains the plurality of one-dimension vectors according to a plurality of sampling points corresponding to the plurality of frames.

In an embodiment of the invention, the input signal is a two-dimension signal, and the processor divides the two-dimension signal to a plurality of blocks, obtains the plurality of two-dimension matrices corresponding to a plurality of pixels of the plurality of blocks and transforms the plurality of two-dimension matrices to the plurality of one-dimension vectors.

In an embodiment of the invention, the processor multiplies the projection coefficient by an inverse matrix of the eigenvector to obtain a reconstructed zero-mean vector; adds the average value to the reconstructed zero-mean vector to obtain a recovered one-dimension vector; and arranges the recovered one-dimension vector to a recovered input signal.

Based on the foregoing, the block-based principal component analysis transformation method and the device thereof of the invention properly divides a one-dimension signal or two-dimension signal to a plurality of frames or a plurality of blocks in order to obtain a plurality of corresponding one-dimension vectors; next, after arranging the plurality of one-dimension vectors to a two-dimension vector, subtracts an average value of the plurality of one-dimension vectors in a number of the division number to obtain a zero-mean vector; calculates a covariance matrix of the zero-mean vector; calculates an eigenvector of the covariance matrix; and then multiplies the zero-mean vector by the eigenvector to obtain a projection coefficient, which serves as a transformation output of the PCA of the invention. The invention further multiplies the projection coefficient by an inverse matrix of the eigenvector by an inverse transformation to retrieve a reconstructed zero-mean vector, adds the average value to the zero-mean vector to obtain a recovered one-dimension vector, and, lastly, arranges the recovered one-dimension vector to frames or blocks in designated sizes.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 9 is a schematic figure comparing a blocked-based principal component analysis of the invention and the traditional principal component analysis.

DESCRIPTION OF THE EMBODIMENTS

Figure 1:
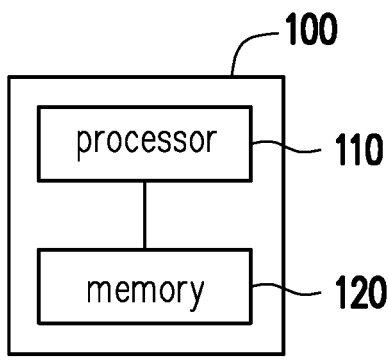
FIG. 1 is a block diagram of a blocked-based principal component analysis transformation device according to an embodiment of the invention.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

FIG. 1 is a block diagram of a blocked-based principal component analysis transformation device according to an embodiment of the invention.

Referring to FIG. 1, a blocked-based principal component analysis transformation device 100 of the invention includes a processor 110 and a memory 120. The memory 120 is coupled to the processor 110.

The processor 110 is, for example, a central processing unit (CPU) or other programmable microprocessor for general use or special use, a digital signal processor (DSP), a programmable controller, an application specific integrated circuit (ASIC), other similar components, or a combination of the foregoing.

The memory 120 is, for example, any type of stationary or movable random access memory (RAM), read-only memory (ROM), flash memory, hard disk drive (HHD), solid state drive (SSD), other similar components, or a combination of the foregoing.

In an embodiment of the invention, the blocked-based principal component analysis transformation device 100 may receive an input signal such as a speech signal or an image signal through a communication component (not illustrated) and store or temporarily store the input signal in the memory 120 for the processor 110 to perform a transformation and an inverse transformation of PCA to the input signal.

Figure 2:
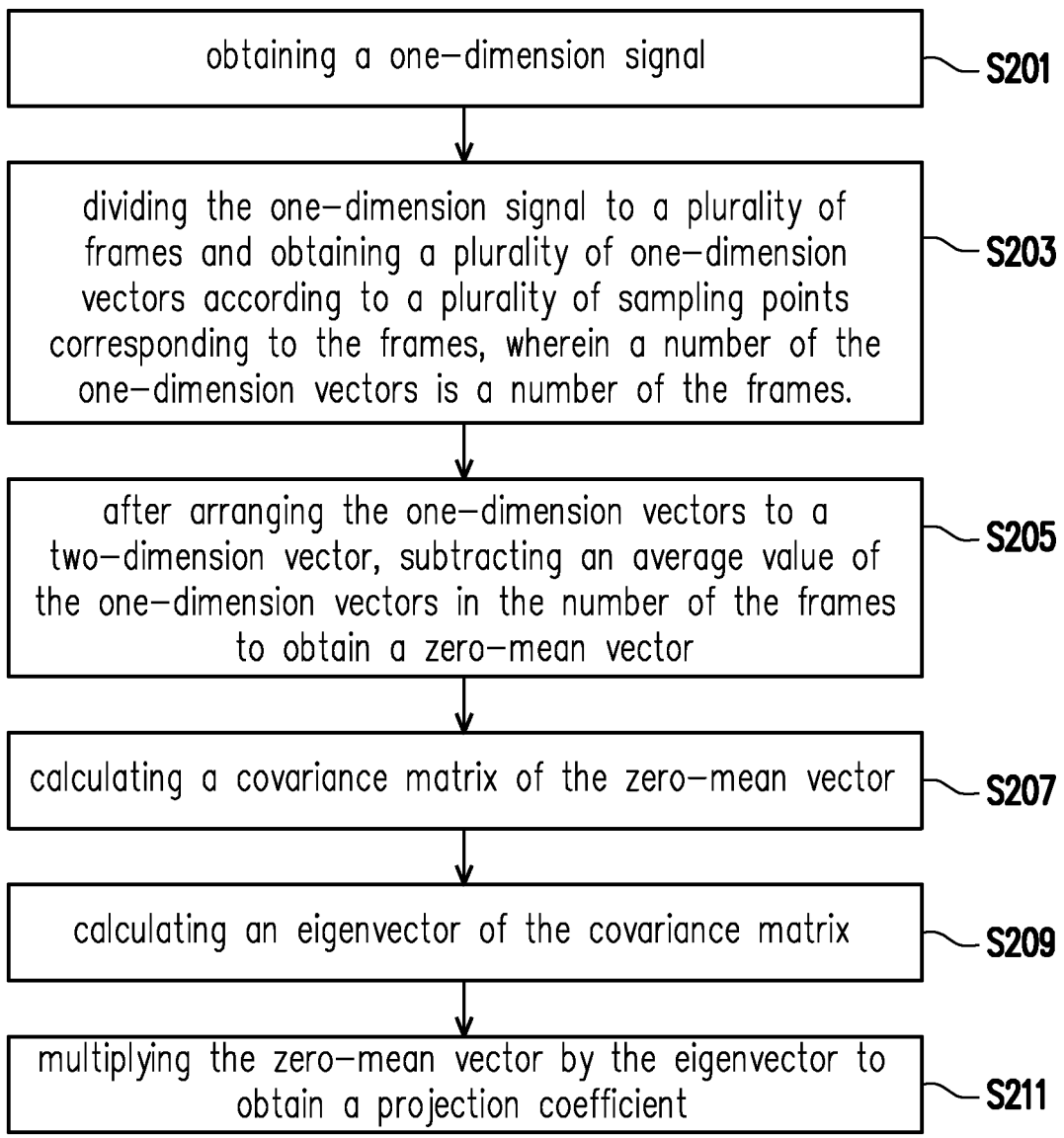
FIG. 2 is a flow chart of a transformation of a blocked-based principal component analysis transformation method according to an embodiment of the invention.

FIG. 2 is a flow chart of a transformation of a blocked-based principal component analysis transformation method according to an embodiment of the invention.

Referring to FIG. 2, a one-dimension signal is obtained in step S201. The one-dimension signal is, for example, a 32-bit floating-point quantization speech signal having a sampling frequency of 44.1 k.

In step S203, the one-dimension signal is divided to a plurality of frames, and a plurality of one-dimension vectors are obtained according to a plurality of sampling points corresponding to the plurality of frames, wherein a number of the plurality of one-dimension vectors is a number of the plurality of frames. In specific, the processor 110 divides the one-dimension signal according to the plurality of frames in designated sizes, as represented by equation (1).

$$X_f = [x_{(f-1)n+1}, x_{(f-1)n+2}, \ldots, x_{(f-1)n+n}]^T, \text{ where } f=1, \ldots, F \quad (1)$$

where f is an $j^{th}$ frame of the one-dimension signal, F is a number of the plurality of frames of the one-dimension signal, n is a number of the plurality of sampling points in the plurality of frames, and T is a transpose of matrix.

In step S205, after arranging the plurality of one-dimension vectors to a two-dimension vector, an average value of the plurality of one-dimension vectors in the number of the plurality of frames is subtracted to obtain a zero-mean vector. In specific, the processor 110 arranges the plurality of original n×1 one-dimension vectors to an n×F two-dimension vector according to equation (2).

$$X_V = [X_1, X_2, \ldots, X_f \ldots X_F], \text{ where } f=1, \ldots, F \quad (2)$$

A zero-mean vector $Z_V$ is represented by equation (3), wherein the average value of the plurality of one-dimension vectors in the number of the plurality of frames is represented by equation (4).

$$Z_V = X_V - \overline{X_V} \quad (3)$$

-continued $$\overline{X_V} = \frac{1}{F}\sum_{f=1}^{F} X_f \quad (4)$$

In step S207, a covariance matrix of the zero-mean vector is calculated. A covariance matrix C is represented by equation (5).

$$C = \operatorname{cov}(Z_V) = \frac{1}{F-1}\sum_{f=1}^{F} Z_f Z_f^T \quad (5)$$

In step S209, an eigenvector of the covariance matrix is calculated. In specific, the processor 110 extracts an eigenvector $e_{vec}$ by a matrix decomposition method, and the eigenvector is a basis function of the frame-based PCA of the invention, and d(•) represents the matrix decomposition method, as represented by equation (6).

$$e_{vec} \times e_{val} \times e_{vec}^T = d(C) \quad (6)$$

In step S211, the zero-mean vector is multiplied by the eigenvector to obtain a projection coefficient. A projection coefficient P is a transformation output of the frame-based PCA of the invention, as represented by equation (7).

$$e_{vec} \times Z_V = P \quad (7)$$

Figure 3:
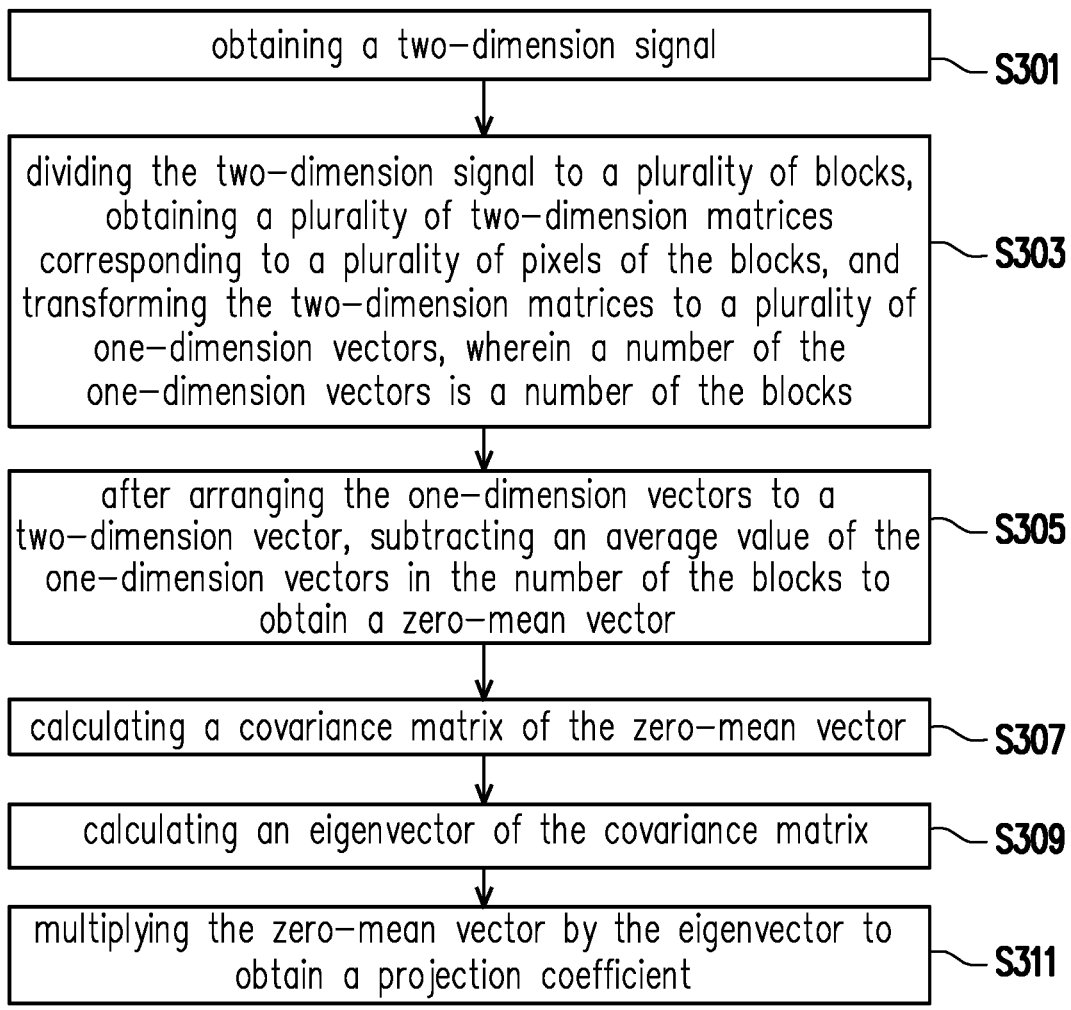
FIG. 3 is a flow chart of a transformation of a blocked-based principal component analysis transformation method according to another embodiment of the invention.

FIG. 3 is a flow chart of a transformation of a blocked-based principal component analysis transformation method according to another embodiment of the invention.

Referring to FIG. 3, in step S301, a two-dimension signal is obtained. The two-dimension signal is, for example, an 8-bit quantization two-dimension 256×256 image signal.

In step S303, the two-dimension signal is divided to a plurality of blocks, a plurality of two-dimension matrices corresponding to a plurality of pixels of the plurality of blocks are obtained, and the plurality of two-dimension matrices are transformed to a plurality of one-dimension vectors, wherein a number of the plurality of one-dimension vectors is a number of the plurality of blocks. In specific, the processor 110 divides the one-dimension signal according to the plurality of blocks in designated sizes, as represented by equation (8).

$$X_{r,c} = \begin{bmatrix} x_{(r-1)p+1,(c-1)q+1} & x_{(r-1)p+1,(c-1)q+2} & \cdots & x_{(r-1)p+1,(c-1)q+q} \\ x_{(r-1)p+2,(c-1)q+1} & x_{(r-1)p+2,(c-1)q+2} & \cdots & x_{(r-1)p+2,(c-1)q+q} \\ \vdots & & \ddots & \vdots \\ x_{(r-1)p+p,(c-1)q+1} & x_{(r-1)p+p,(c-1)q+2} & \cdots & x_{(r-1)p+p,(c-1)q+q} \end{bmatrix}, \quad (8)$$

$$\text{where } \begin{array}{l} r = 1, \ldots, R \\ c = 1, \ldots, C \end{array}$$

where r is a block on a $r^{th}$ row of the two-dimension signal, c is a block on a $c^{th}$ column of the two-dimension signal, R is a total number of the plurality of blocks in rows, C is a total number of the plurality of blocks in columns, p is a number of rows of the plurality of pixels in the plurality of blocks, and q is a number of columns of the plurality of pixels in the plurality of blocks.

Next, the processor 110 further uses $\mathbb{V}(\cdot)$ to transform the plurality of two-dimension matrices to the plurality of one-dimension vectors, as represented by equation (9).

$$X_v = [X_1, X_2, \ldots, X_{p\times q}]^T = \mathbb{V}(X_{r,c}) \quad (9)$$
$$= [X_{1,1}, X_{2,1}, \ldots, X_{p,1}, X_{1,2}X_{2,2}, \ldots, X_{p,2}, \ldots, X_{p,q}]^T,$$

$$\text{where } \begin{array}{l} r = 1, \ldots, R \\ c = 1, \ldots, C \\ v = 1, \ldots, R \times C \end{array}$$

In step S305, after arranging the plurality of one-dimension vectors to a two-dimension vector, an average value of the plurality of one-dimension vectors in the number of the plurality of blocks is subtracted to obtain a zero-mean vector. In specific, the processor 110 arranges the plurality of original (p×q)×B one-dimension vectors to a (p×q)×B two-dimension vector according to equation (10), wherein B is a product of R and C.

$$X_V = [X_1, X_2, \ldots, X_v, \ldots, X_{R\times C}], \text{ where } v=1, \ldots, R\times C \quad (10)$$

The zero-mean vector $Z_V$ is represented by equation (11), wherein the average value of the plurality of one-dimension vectors in the number of the plurality of blocks is represented by equation (12).

$$Z_V = X_V - \overline{X_V} \quad (11)$$

$$\overline{X_V} = \frac{1}{V}\sum_{v=1}^{V} X_v \quad (12)$$

In step S307, a covariance matrix of the zero-mean vector is calculated. A covariance matrix C is represented by equation (13).

$$C = \operatorname{cov}(Z_V) = \frac{1}{V-1}\sum_{v=0}^{V} Z_v Z_v^T \quad (13)$$

In step S309, an eigenvector of the covariance matrix is calculated. In specific, the processor 110 extracts an eigenvector $e_{vec}$ by a matrix decomposition method, and the eigenvector is a basis function of the block-based PCA of the invention, and d(•) represents the matrix decomposition method same as that represented by equation (6).

In step S311, the zero-mean vector is multiplied by the eigenvector to obtain a projection coefficient. A projection coefficient P is a transformation output of the block-based PCA of the invention, same as that represented by equation (7).

Figure 4:
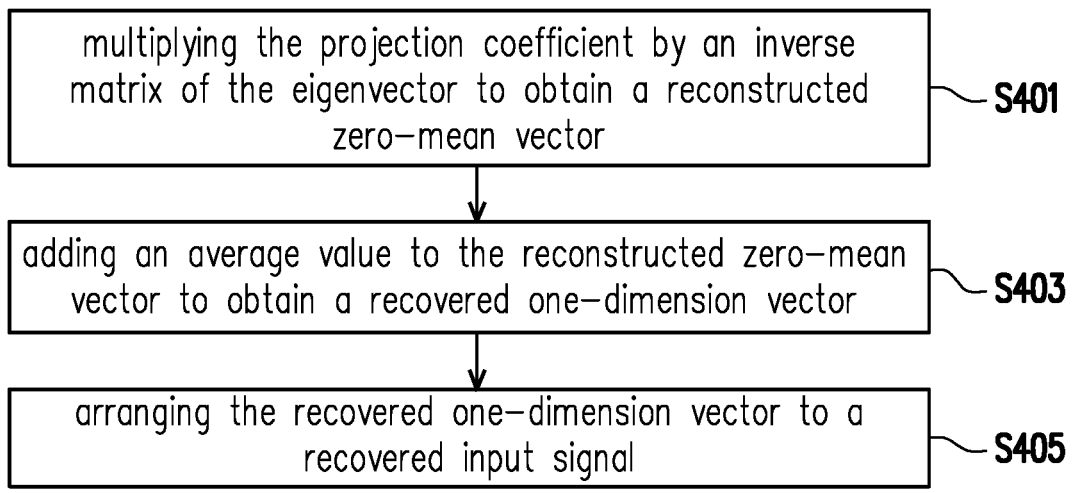
FIG. 4 is a flow chart of an inverse transformation of a blocked-based principal component analysis transformation method according to an embodiment of the invention.

FIG. 4 is a flow chart of an inverse transformation of a blocked-based principal component analysis transformation method according to an embodiment of the invention.

Referring to FIG. 4, in step S401, the projection coefficient is multiplied by an inverse matrix of the eigenvector to obtain a reconstructed zero-mean vector. In specific, the processor 110 obtains a reconstructed zero-mean vector simply by multiplying the projection coefficient by the inverse matrix of the eigenvector, as represented by equation (14).

$$e_{vec} \times P = Z'_V \quad (14)$$

Because the eigenvector is an orthogonal matrix, the inverse matrix of the eigenvector is identical to a transposed matrix of the eigenvector.

In step S403, an average value is added to the reconstructed zero-mean vector to obtain a recovered one-dimension vector, as represented by equation (15).

$$X'_V = Z'_V + \overline{X_V} \quad (15)$$

In step S405, the recovered one-dimension vector is arranged to a recovered input signal.

If the original input signal is a one-dimension signal, the recovered one-dimension vector is as represented by equation (16), and the recovered input signal is as represented by equation (17).

$$X_{re}=[(X'_1)^T,(X'^2)^T,\ldots(X'_f)^T,\ldots(X'_F)^T], \text{ where } f=1,\ldots,F \quad (16)$$

$$X'_f=[x'_{(f-1)n+1},x'_{(f-1)n+2},\ldots,x'_{(f-1)n+n}]^T, \text{ where } f=1,\ldots,F \quad (17)$$

If the original input signal is a two-dimension signal, the recovered one-dimension vector is as represented by equation (18), and the recovered input signal is as represented by equation (19). It is noteworthy that, $\mathbb{S}(\bullet)$ in equation (19) is a transfer function of arranging the plurality of one-dimension vectors to a two-dimension matrix in a designated size.

$$X_{re} = [X'_{r,c}] = \begin{bmatrix} X'_{1,1} & X'_{1,2} & & X'_{1,C} \\ X'_{2,1} & X'_{2,2} & & X'_{2,C} \\ \vdots & & \ddots & \vdots \\ X'_{R,1} & X'_{R,2} & \cdots & X'_{R,C} \end{bmatrix}, \quad (18)$$

where
$r = 1, \ldots, R$
$c = 1, \ldots, C$ $$X'_{r,c} = \mathbb{S}(X'_v) = \begin{bmatrix} x'_{1,1} & x'_{1,2} & & x'_{1,q} \\ x'_{2,1} & x'_{2,2} & & x'_{2,q} \\ \vdots & & \ddots & \vdots \\ x'_{p,1} & x'_{p,2} & \cdots & x'_{p,q} \end{bmatrix} \quad (19)$$

Table 1 and Table 2 are provided hereinafter to describe the quality test on the inverse transformation recovery and the error on a sampling unit.

Table 1 shows the difference between an original one-dimension speech signal having a sampling frequency of 44.1 k and the speech signal being inverse transformed (i.e. a signal to noise ratio, SNR).

TABLE 1

| Test item | SNR |
| --- | --- |
| Recovered data of inverse transformation | 287.7907 |
| Recovered data of a speech sampling point with an amplitude error of 0.5 | 262.9465 |
| Recovered data after a rounding process | ∞ |

Table 2 shows the difference between an original 256×256 two-dimension image signal and the image signal being inverse transformed (i.e. peak signal to noise ratio, PSNR).

TABLE 2

| Test item | PSNR |
| --- | --- |
| Recovered PSNR of inverse transformation | 299.1945 |
| PSNR of an image pixel with a grayscale | 102.3162 |

TABLE 2-continued

| Test item | PSNR |
| --- | --- |
| error of 0.5 | |
| Recovered data after a rounding process | ∞ |

According to Table 1 and Table 2, when a recovery signal is not quantified, it can be shown by the recovered SNR and PSNR of the inverse transformation that the original signal cannot be completely recovered in the recovery test. If an error of 0.5 is added to one point of the signal with and results in the SNR and PSNR results both smaller than the SNR and PSNR values recovered simply by inverse transformation, it shows that the error generated by the inverse transformation is smaller than the difference made by the error of 0.5. Lastly, the signal is completely recovered by the inverse transformation using a rounding process to eliminate the errors in a digital signal.

Figure 5A:
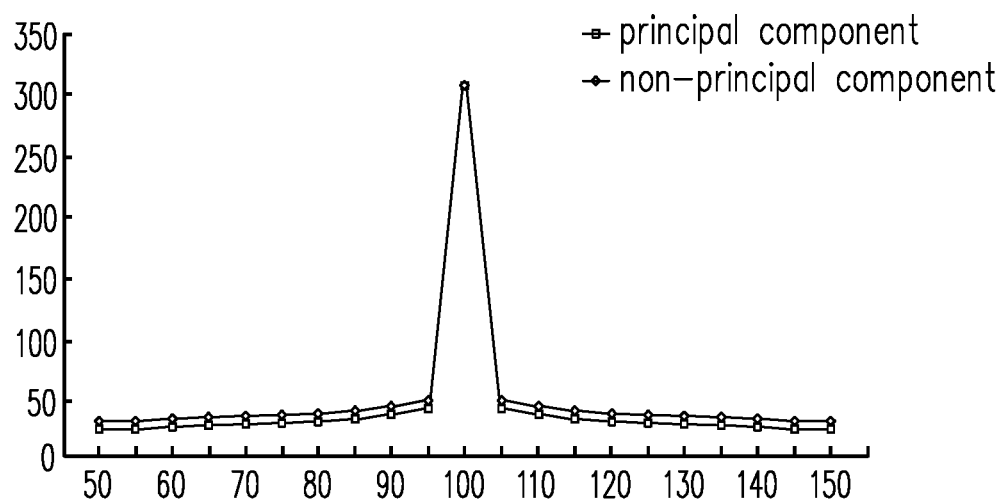
FIG. 5A and FIG. 5B are schematic figures illustrating how errors of a projection coefficient of a blocked-based principal component analysis transformation method of the invention influence the image quality of a principal component and a non-principal component respectively in a spacial domain.
Figure 5B:
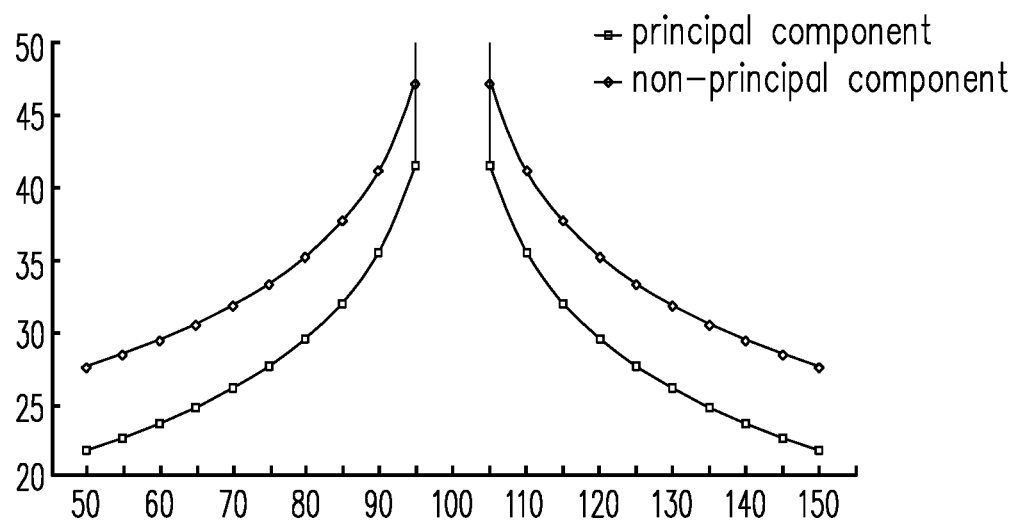
Figure 6A:
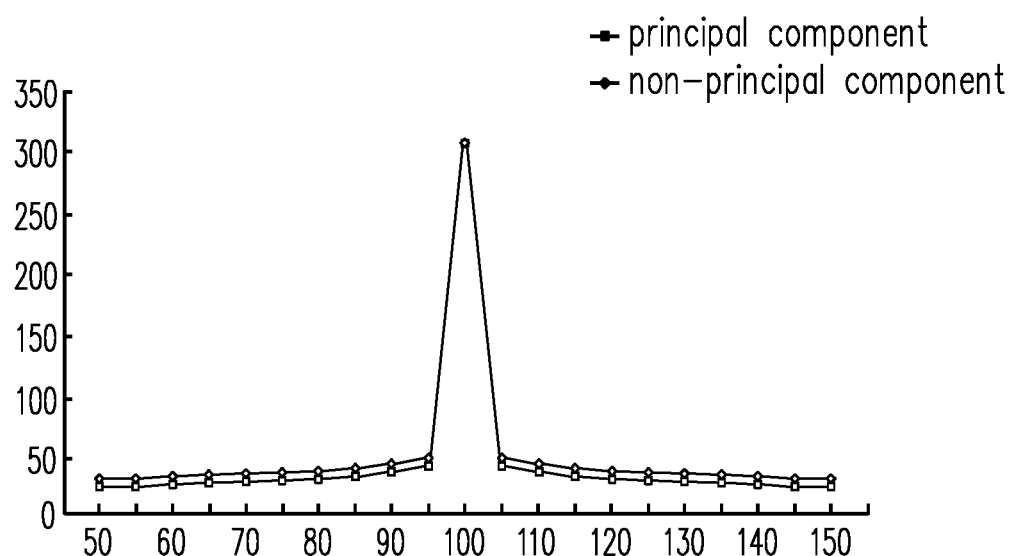
FIG. 6A and FIG. 6B are schematic figures illustrating how errors of a projection coefficient of a blocked-based principal component analysis transformation method of the invention influence the image quality of a principal component and a non-principal component respectively in a frequency domain.
Figure 6B:
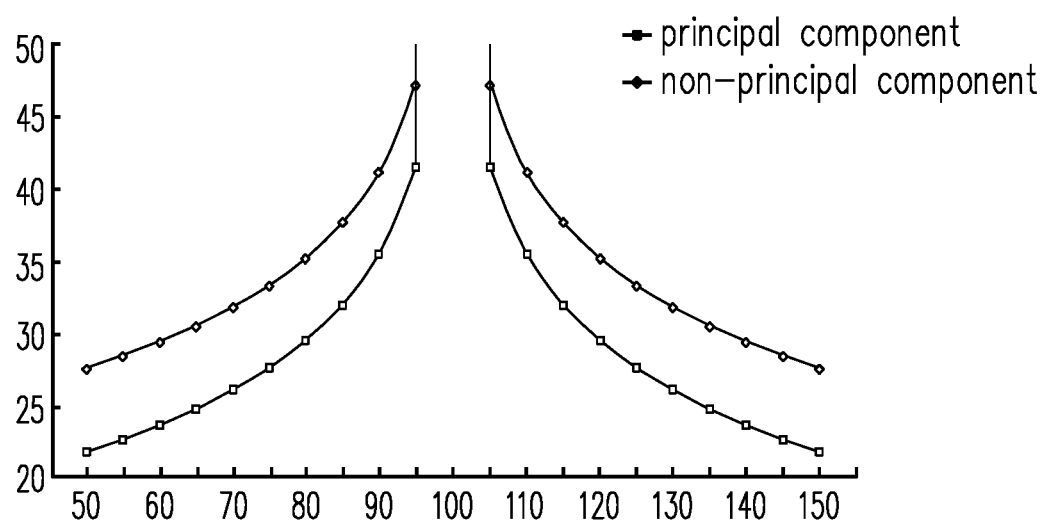

FIG. 5A and FIG. 5B are schematic figures illustrating how errors of a projection coefficient of a blocked-based principal component analysis transformation method of the invention influence the image quality of a principal component and a non-principal component respectively in a spacial domain. FIG. 6A and FIG. 6B are schematic figures illustrating how errors of a projection coefficient of a blocked-based principal component analysis transformation method of the invention influence the image quality of a principal component and a non-principal component respectively in a frequency domain.

In FIG. 5A, FIG. 5B, FIG. 6A and FIG. 6B, all the horizontal axes represent a percentage of projection coefficient error, and all the vertical axes represent a PSNR. FIG. 5B is a partial enlarged view of FIG. 5A. FIG. 6B is a partial enlarged view of FIG. 6A.

FIG. 5A shows how the changing of magnification of the projection coefficient on the image signal in a spacial domain influences the quality of the recovered signal. FIG. 6A shows how the changing of magnification of the projection coefficient on the image signal in a frequency domain influences the quality of the recovered signal. In FIG. 5A and FIG. 6A, both tests are operated with 8×8 divided blocks. FIG. 5A and FIG. 6A prove that the block-based PCA of the invention has identical influence to the robust of the image quality when processing data in a spacial domain and processing data in a frequency domain. In addition, the PSNR of FIG. 5A and FIG. 6A prove that the quality of the reconstructed signal revised by the non-principal component projection coefficient is better than the reconstructed signal revised by the principal component projection coefficient. The PSNR of the reconstructed image that changes ±20% of the principal component coefficient is about 35 dB, and the PSNR of the reconstructed image that changes ±10% of the principal component coefficient is about 35 dB. Since the reconstructed image still has good quality, the projection coefficient may also serve as a carrier space for data hiding and provide information such as watermark for utilization in hiding techniques.

Figure 7A:
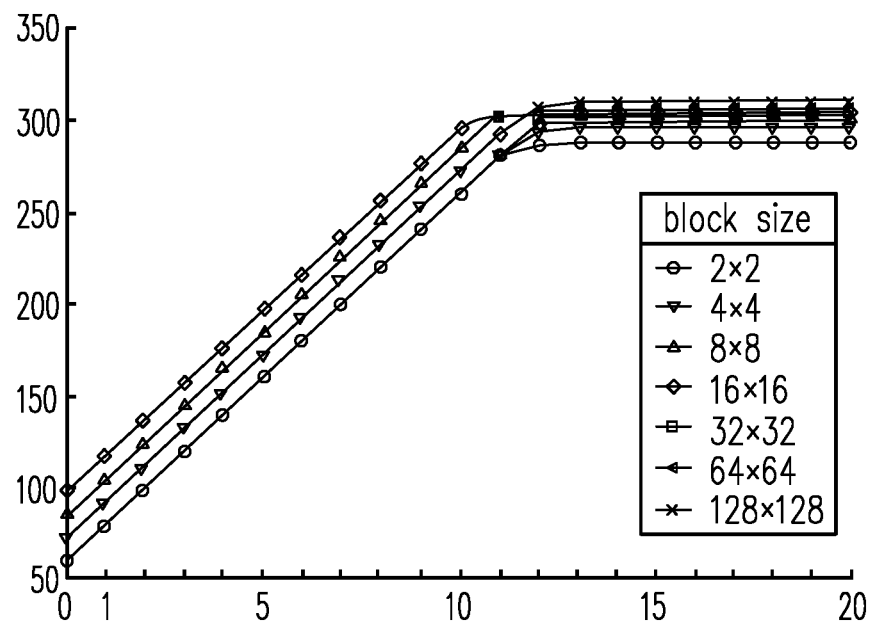
FIG. 7A and FIG. 7B are schematic figures comparing the quality of divided blocks in different sizes and with a projection coefficient quantified to different decimal places.
Figure 7B:
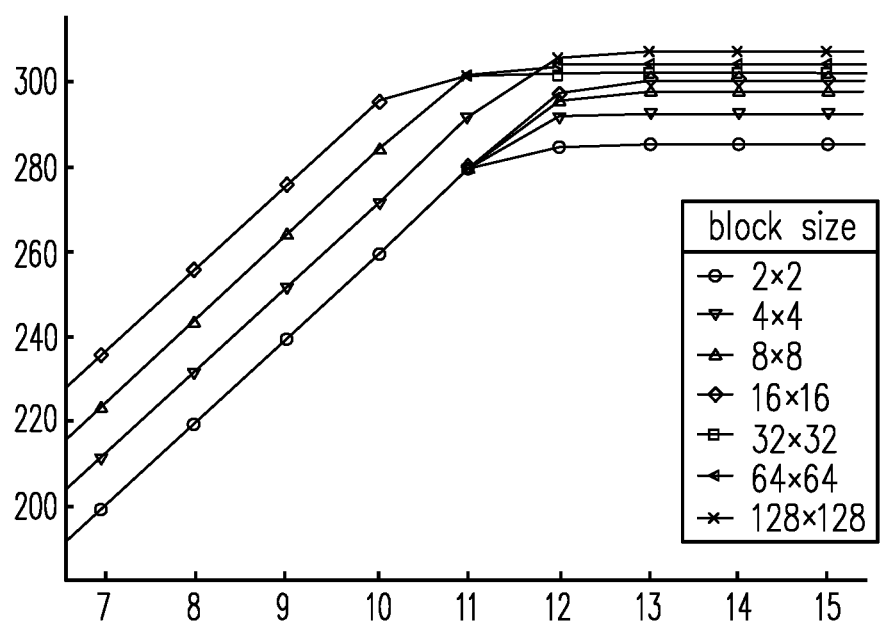

FIG. 7A and FIG. 7B are schematic figures comparing the quality of divided blocks in different sizes and with a projection coefficient quantified to different decimal places. FIG. 7B is a partial enlarged view of FIG. 7A. In FIG. 7A and FIG. 7B, both of the horizontal axes represent a number of decimal places, and both of the vertical axes represent a PSNR.

FIG. 7A shows a comparison of the image quality quantified to $0^{th}$ to $20^{th}$ decimal place when the image is divided to different block sizes in the block-based PCA method of the invention. When quantified to the $13^{th}$ or more than $13^{th}$ decimal places, regardless of the change of the block size, the PSNR of the reconstructed image quality does not increase, wherein a block has the greatest PSNR when having a block size of 32×32. Besides, in view of FIG. 7B, when quantified to the $12^{th}$ or less than $12^{th}$ decimal places, a block has the greatest PSNR when having a block size of 128×128; when quantified to less than $12^{th}$ decimal places, a block has the greatest PSNR when having a block size of 32×32.

Table 3 is a test result of the recovery quality of the projection coefficient through a rounding process when decimal places is quantified under different block sizes.

TABLE 3

| Block size | $0^{th}$ decimal place | $1^{st}$ decimal place |
|---|---|---|
| 2 × 2 | 58.7529 | ∞ |
| 4 × 4 | 58.9133 | ∞ |
| 8 × 8 | 58.9348 | ∞ |
| 16 × 16 | 60.2415 | ∞ |
| 32 × 32 | ∞ | ∞ |
| 64 × 64 | ∞ | ∞ |
| 128 × 128 | ∞ | ∞ |

In view of Table 3, regardless of the block size, in the PCA method of the invention, when quantifying to the first decimal place, the original image in the blocks of all sizes are completely reconstructed, and the PSNR is infinite.

Figure 8:
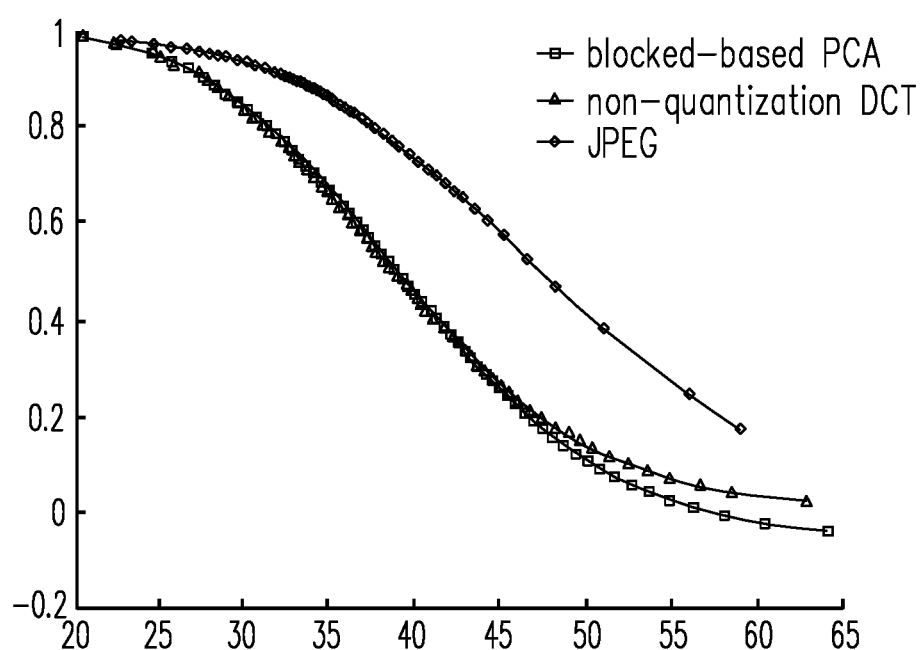
FIG. 8 is a schematic figure comparing a data size of a blocked-based principal component analysis of the invention, a data size of a non-quantization discrete cosine transformation and a data size of a quantization discrete cosine transformation.

FIG. 8 is a schematic figure comparing a data size of a blocked-based principal component analysis of the invention, a data size of a non-quantization discrete cosine transform (DCT) and a data size of a quantization discrete cosine transform (i.e. JPEG).

In FIG. 8, the horizontal axis represents a PSNR, and the vertical axis represents a compressing rate. In FIG. 8, the data size of the blocked-based PCA is always larger than the data size of the quantization discrete cosine transformation when the PSNR rises. However, in the comparison between the data size of the block-based PCA and the data size of the non-quantization DCT, for example, the line with square markers and the line with triangle markers, when the compressing rate is greater than 0.8, the quality of the recovered image (i.e. the PSNR) of the block-based PCA and that of the non-quantization DCT are very close. On the other hand, when the compressing rate falls within a range of 0.1 to 0.8, the quality of the recovered image of the block-based PCA is slightly better than that of the recovered image of the non-quantization DCT. On the other hand, when the compressing rate is smaller than 0.1, because the projection coefficient and eigenvector generated by the block-based PCA are slightly greater than the original data size, the compressing rate of the block-based PCA is a negative value before operating any more effective quantization vector algorithm, which means that the data size is slightly larger than the original data size. The data size of the block-based PCA and the non-quantization DCT are really similar, in view of the comparison therebetween. Therefore, it is necessary to develop an effective quantization vector algorithm of the block-based PCA.

FIG. 9 is a schematic figure comparing a blocked-based principal component analysis of the invention and the traditional principal component analysis.

FIG. 9 compares the time cost for calculating, the data size and the quality of the recovered image of the blocked-based PCA with those of the traditional PCA. Regarding the time cost for calculating, the blocked-based PCA of the invention enhances the processing speed effectively. The calculation amount of the block-based CPA is better than the traditional CPA when the size of the divided blocks is 128×128, but the data size of the block-based CPA is larger than the traditional CPA at a 95% confidence level. However, when the size of the divided blocks is smaller than 64×64, the block-based CPA is better than the traditional CPA not only in terms of the calculation amount, but the data size of the block-based CPA is also smaller than the traditional CPA at a 95% confidence level. Moreover, it is proved by the PSNR that the reconstructed information completely recovers the original information losslessly.

Figure 10:
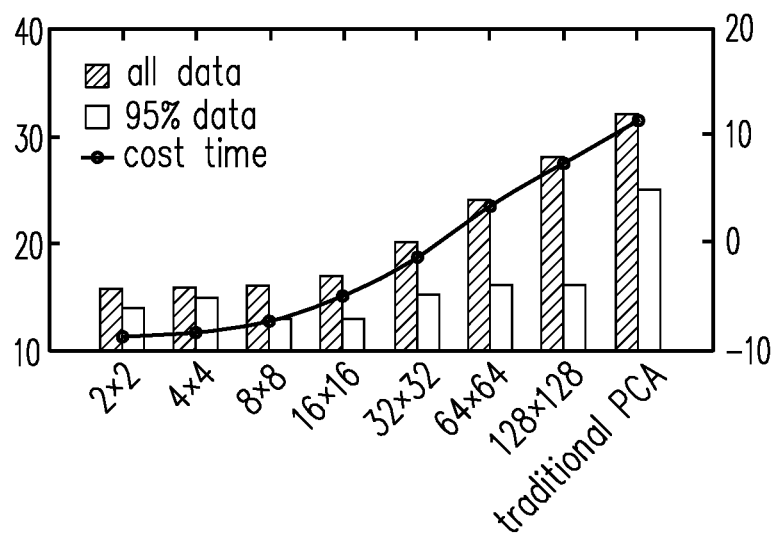
FIG. 10 is a schematic figure comparing a time cost for operating a blocked-based principal component analysis method of the invention and a data size required for reconstruction in the blocked-based principal component analysis method.

FIG. 10 is a schematic figure comparing a time cost for operating a blocked-based PCA method of the invention and a data size required for reconstruction in the blocked-based PCA method.

In FIG. 10, the horizontal axis represents the block size, and there is only one block in the whole image in the traditional PCA, i.e. the image is not divided. The vertical axis on the left represents the data size, and the unit thereof is 64-bit floating-point number in a number of 2 to the power of n. The vertical axis on the right represents the cost time, and the unit thereof is 10 to the power of n seconds. FIG. 10 is a schematic figure showing the information in the table of FIG. 9.

In summary of the foregoing, the PCA transformation method and the device thereof properly divides a one-dimension signal or two-dimension signal to a plurality of frames or a plurality of blocks in order to obtain a plurality of corresponding one-dimension vectors, calculates a zero-mean vector of the plurality of one-dimension vectors and calculates a covariance matrix of the zero-mean vector, calculates an eigenvector of the covariance matrix, then multiplies the zero-mean vector by the eigenvector to obtain a projection coefficient, which serves as a transformation output of the PCA of the invention. The invention further multiplies the projection coefficient by an inverse matrix of the eigenvector by an inverse transformation to retrieve a reconstructed zero-mean vector, adds an average value to the zero-mean vector to obtain a recovered one-dimension vector, and, lastly, arranges the recovered one-dimension vector to frames or blocks in designated sizes. In addition, under the premise of a small data size, the PCA transformation method further achieves complete recovery of input signal, which other prior methods cannot achieve.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A blocked-based principal component analysis transformation method, comprising:
   obtaining an input signal;
   dividing the input signal and obtaining a plurality of one-dimension vectors corresponding to the divided input signal, wherein a number of the plurality of one-dimension vectors is a division number;
   after arranging the plurality of one-dimension vectors to a two-dimension vector, subtracting an average value of the plurality of one-dimension vectors of the division number to obtain a zero-mean vector;
   calculating a covariance matrix of the zero-mean vector;
   calculating an eigenvector of the covariance matrix; and multiplying the zero-mean vector by the eigenvector to obtain a projection coefficient.

2. The blocked-based principal component analysis transformation method according to claim 1, wherein the input signal is a one-dimension signal, and the process of dividing the input signal and obtaining the plurality of one-dimension vectors corresponding to the divided input signal comprises:
dividing the one-dimension signal to a plurality of frames and obtaining the plurality of one-dimension vectors according to a plurality of sampling points corresponding the frames.

3. The blocked-based principal component analysis transformation method according to claim 2, wherein the one-dimension signal is a speech signal.

4. The blocked-based principal component analysis transformation method according to claim 1, wherein the input signal is a two-dimension signal, and the process of dividing the input signal and obtaining the plurality of one-dimension vectors corresponding to the divided input signal comprises:
dividing the two-dimension signal to a plurality of blocks, obtaining a plurality of two-dimension matrices corresponding to a plurality of pixels of the plurality of blocks and transforming the plurality of two-dimension matrices to the plurality of one-dimension vectors.

5. The blocked-based principal component analysis transformation method according to claim 4, wherein the two-dimension signal is an image signal.

6. The blocked-based principal component analysis transformation method according to claim 1, further comprising:
multiplying the projection coefficient by an inverse matrix of the eigenvector to obtain a reconstructed zero-mean vector;
adding the average value to the reconstructed zero-mean vector to obtain a recovered one-dimension vector; and
arranging the recovered one-dimension vector to a recovered input signal.

7. A blocked-based principal component analysis transformation device, comprising:
a processor; and
a memory coupled to the processor, wherein the processor obtains an input signal;
dividing the input signal and obtaining a plurality of one-dimension vectors corresponding to the divided input signal, wherein a number of the plurality of one-dimension vectors is a division number;
after arranging the plurality of one-dimension vectors to a two-dimension vector, subtracts an average value of the plurality of one-dimension vectors of the division number to obtain a zero-mean vector;
calculates a covariance matrix of the zero-mean vector;
calculates an eigenvector of the covariance matrix; and
multiplying the zero-mean vector by the eigenvector to obtain a projection coefficient.

8. The blocked-based principal component analysis transformation device according to claim 7, wherein the input signal is a one-dimension signal, and the processor divides the one-dimension signal to a plurality of frames and obtains the plurality of one-dimension vectors according to a plurality of sampling points corresponding to the plurality of frames.

9. The blocked-based principal component analysis transformation device according to claim 7, wherein the input signal is a two-dimension signal, and the processor divides the two-dimension signal to a plurality of blocks, obtains the plurality of two-dimension matrices corresponding to a plurality of pixels of the plurality of blocks and transforms the plurality of two-dimension matrices to the plurality of one-dimension vectors.

10. The blocked-based principal component analysis transformation device according to claim 7, wherein the processor multiplies the projection coefficient by an inverse matrix of the eigenvector to obtain a reconstructed zero-mean vector, adds the average value to the reconstructed zero-mean vector to obtain a recovered one-dimension vector, and arranges the recovered one-dimension vector to a recovered input signal.

* * * * *